United States Patent
Joshi et al.

[11] Patent Number: 6,147,402
[45] Date of Patent: *Nov. 14, 2000

[54] REFRACTORY METAL CAPPED LOW RESISTIVITY METAL CONDUCTOR LINES AND VIAS

[75] Inventors: Rajiv V. Joshi, Yorktown Heights; Jerome J. Cuomo, Lincolndale; Hormazdyar M. Dalal, Milton; Louis L. Hsu, Fishkill, all of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/113,918

[22] Filed: Jul. 10, 1998

Related U.S. Application Data

[63] Continuation of application No. 08/753,991, Dec. 3, 1996, Pat. No. 5,889,328, which is a continuation of application No. 08/346,208, Nov. 22, 1994, Pat. No. 5,585,673, which is a division of application No. 08/125,107, Sep. 21, 1993, Pat. No. 5,426,330, which is a continuation of application No. 07/841,967, Feb. 26, 1992, Pat. No. 5,300,813, and application No. 07/928,335, Aug. 12, 1992, Pat. No. 5,403,779, which is a division of application No. 07/841,967.

[51] Int. Cl.⁷ ......................... H01L 29/440; H01L 29/460
[52] U.S. Cl. ......................... 257/751; 257/763; 257/764; 257/762
[58] Field of Search ................... 257/751, 763, 257/764, 915, 758, 762

[56] References Cited

U.S. PATENT DOCUMENTS

| | | | |
|---|---|---|---|
| 3,881,242 | 5/1975 | Nuttall et al. | 29/589 |
| 3,911,562 | 10/1975 | Youmans | 29/590 |
| 4,116,791 | 9/1978 | Zega | 204/192 |

(List continued on next page.)

FOREIGN PATENT DOCUMENTS

| | | |
|---|---|---|
| 2035106 | of 1991 | Canada. |
| 0 070 737 | 7/1981 | European Pat. Off.. |
| 0 044 372 | 1/1982 | European Pat. Off.. |

(List continued on next page.)

OTHER PUBLICATIONS

J.L. Vossen, "Thin Film Processes" Academic Press, 1978 pp. 32–39.

(List continued on next page.)

*Primary Examiner*—Leo P. Picard
*Assistant Examiner*—Hung Van Duong
*Attorney, Agent, or Firm*—Steven J. Soucar; Lawrence D. Cutter

[57] ABSTRACT

Capping a low resistivity metal conductor line or via with a refractory metal allows for effectively using chemical-mechanical polishing techniques because the hard, reduced wear, properties of the refractory metal do not scratch, corrode, or smear during chemical-mechanical polishing. Superior conductive lines and vias are created using a combination of both physical vapor deposition (e.g., evaporation or collimated sputtering) of a low resistivity metal or alloy followed by chemical vapor deposition (CVD) of a refractory metal and subsequent planarization. Altering a ratio of $SiH_4$ to $WF_6$ during application of the refractory metal cap by CVD allows for controlled incorporation of silicon into the tungsten capping layer. Collimated sputtering allows for creating a refractory metal liner in an opening in a dielectric which is suitable as a diffusion barrier to copper based metalizations as well as CVD tungsten. Ideally, for faster diffusing metals like copper, liners are created by a two step collimated sputtering process wherein a first layer is deposited under relatively low vacuum pressure where directional deposition dominates (e.g., below 1 mTorr) and a second layer is deposited under relatively high vacuum pressure where scattering deposition dominates (e.g., above 1 mTorr). For refractory metals like CVD tungsten, the liner can be created in one step using collimated sputtering at higher vacuum pressures.

27 Claims, 7 Drawing Sheets

U.S. PATENT DOCUMENTS

| | | | |
|---|---|---|---|
| 4,226,082 | 10/1980 | Nishida | 368/285 |
| 4,244,775 | 1/1981 | D'Asara | 156/636 |
| 4,305,974 | 12/1981 | Abe et al. | 427/89 |
| 4,339,305 | 7/1982 | Jones | 156/650 |
| 4,367,119 | 1/1983 | Logan et al. | 156/643 |
| 4,386,116 | 5/1983 | Nair et al. | 427/99 |
| 4,486,946 | 12/1984 | Jopke, Jr. et al. | 29/590 |
| 4,505,025 | 3/1985 | Kurosawa et al. | 29/576 |
| 4,520,041 | 5/1985 | Aoyama et al. | 427/88 |
| 4,526,631 | 7/1985 | Silvestri | 148/175 |
| 4,532,702 | 8/1985 | Gigante et al. | 29/758 |
| 4,536,249 | 8/1985 | Rhodes | 156/643 |
| 4,545,852 | 10/1985 | Barton | 156/643 |
| 4,560,435 | 12/1985 | Brown et al. | 156/643 |
| 4,560,436 | 12/1985 | Bukhman et al. | 156/643 |
| 4,565,157 | 1/1986 | Broros et al. | 118/719 |
| 4,582,563 | 4/1986 | Hazuki et al. | 156/643 |
| 4,597,826 | 7/1986 | Majima et al. | |
| 4,600,624 | 7/1986 | Joseph et al. | 428/161 |
| 4,617,087 | 10/1986 | Iyer et al. | 156/643 |
| 4,624,864 | 11/1986 | Hartman | 423/89 |
| 4,640,004 | 2/1987 | Thomas et al. | 29/590 |
| 4,659,427 | 4/1987 | Barry et al. | 29/590 |
| 4,689,113 | 8/1987 | Balasubramanyam et al. | 156/643 |
| 4,701,349 | 10/1987 | Koyanagi et al. | 427/228 |
| 4,702,792 | 10/1987 | Chow et al. | 156/628 |
| 4,720,908 | 1/1988 | Wills | 437/192 |
| 4,724,060 | 2/1988 | Sakata et al. | 437/192 |
| 4,725,566 | 2/1988 | Ngu et al. | 437/180 |
| 4,732,658 | 3/1988 | Lee | 437/238 |
| 4,746,219 | 5/1988 | Hollloway et al. | 357/23 |
| 4,751,197 | 6/1988 | Wills | 437/174 |
| 4,753,709 | 6/1988 | Welch et al. | 156/643 |
| 4,756,810 | 7/1988 | Lamont, Jr. et al. | 204/192.3 |
| 4,769,686 | 9/1988 | Horiuchi et al. | 204/192.17 |
| 4,783,248 | 11/1988 | Kohlhase et al. | 204/192.17 |
| 4,789,648 | 12/1988 | Chow et al. | 437/225 |
| 4,795,722 | 1/1989 | Welch et al. | 437/192 |
| 4,800,176 | 1/1989 | Kakumu et al. | 437/193 |
| 4,801,559 | 1/1989 | Imaoka | 437/192 |
| 4,822,753 | 4/1989 | Pintchovski et al. | 437/192 |
| 4,824,544 | 4/1989 | Mikalesen et al. | 204/294 |
| 4,824,802 | 4/1989 | Brown et al. | 437/192 |
| 4,845,050 | 7/1989 | Kim et al. | 437/192 |
| 4,847,111 | 7/1989 | Chow et al. | 427/38 |
| 4,849,079 | 7/1989 | Cuomo et al. | 204/192.17 |
| 4,851,295 | 7/1989 | Brors | 428/450 |
| 4,855,798 | 8/1989 | Inamura et al. | 357/71 |
| 4,873,565 | 10/1989 | Roane | 357/71 |
| 4,884,123 | 11/1989 | Dixit et al. | 357/71 |
| 4,897,709 | 1/1990 | Yokoyama et al. | 357/68 |
| 4,920,073 | 4/1990 | Wei et al. | 437/200 |
| 4,924,281 | 5/1990 | Endo et al. | 357/23.9 |
| 4,924,295 | 5/1990 | Kuecher | 357/71 |
| 4,926,237 | 5/1990 | Sun et al. | 357/71 |
| 4,944,836 | 7/1990 | Beyer et al. | 156/645 |
| 4,956,313 | 9/1990 | Cote et al. | 437/203 |
| 4,962,414 | 10/1990 | Liou et al. | 357/71 |
| 4,992,135 | 2/1991 | Doan | 156/636 |
| 4,994,162 | 2/1991 | Armstrong et al. | 204/192.15 |
| 5,008,217 | 4/1991 | Case et al. | 437/195 |
| 5,008,730 | 4/1991 | Huang et al. | 257/751 |
| 5,026,470 | 6/1991 | Boynhard et al. | 204/298.16 |
| 5,027,185 | 6/1991 | Liauh | 357/59 |
| 5,045,916 | 9/1991 | Vor et al. | 357/71 |
| 5,049,975 | 9/1991 | Ajika et al. | 257/760 |
| 5,055,906 | 10/1991 | Mase et al. | 257/760 |
| 5,070,391 | 12/1991 | Liou et al. | 257/750 |
| 5,084,417 | 1/1992 | Joshi et al. | 437/192 |
| 5,112,693 | 5/1992 | Gillery | 428/432 |
| 5,138,432 | 8/1992 | Stanasolovich et al. | 357/71 |
| 5,148,259 | 9/1992 | Kato et al. | 257/771 |
| 5,169,685 | 12/1992 | Woodruf et al. | 427/250 |
| 5,171,412 | 12/1992 | Talieh et al. | 427/250 |
| 5,187,119 | 2/1993 | Cech et al. | 437/187 |
| 5,202,579 | 4/1993 | Fujii et al. | 527/751 |
| 5,243,222 | 9/1993 | Harper et al. | 257/751 |
| 5,262,354 | 11/1993 | Cote et al. | 437/195 |
| 5,278,449 | 1/1994 | Miyalkawa | 257/751 |
| 5,296,404 | 3/1994 | Akahori et al. | 437/173 |
| 5,300,812 | 4/1994 | Joshi et al. | 257/757 |
| 5,401,675 | 3/1995 | Lee et al. | 437/192 |
| 5,444,018 | 8/1995 | Yost et al. | 437/190 |

FOREIGN PATENT DOCUMENTS

| | | |
|---|---|---|
| 0 077 535 | 4/1983 | European Pat. Off. . |
| 0 127 281 | 12/1984 | European Pat. Off. . |
| 0 150 403 | 12/1984 | European Pat. Off. . |
| 0 224 013 | 6/1985 | European Pat. Off. . |
| 0 195 977 | 10/1986 | European Pat. Off. . |
| 0 247 783 | 12/1987 | European Pat. Off. . |
| 0 254 651 | 1/1988 | European Pat. Off. . |
| 0 261 846 | 3/1988 | European Pat. Off. . |
| 0 279 588 | 8/1988 | European Pat. Off. . |
| 0 305 143 | 3/1989 | European Pat. Off. . |
| 0 312 986 | 4/1989 | European Pat. Off. . |
| 0 338 636 | 10/1989 | European Pat. Off. . |
| 0 343 269 | 11/1989 | European Pat. Off. . |
| 59-121835 | of 1984 | Japan . |
| 59-48923 | of 1984 | Japan . |
| 59-72132 | of 1984 | Japan . |
| 60-25475 | of 1985 | Japan . |
| 61-221376 | of 1986 | Japan . |
| 61-95551 | of 1986 | Japan . |
| 61-97825 | 1/1986 | Japan . |
| 62-17173 | of 1987 | Japan . |
| 62-199033 | of 1987 | Japan . |
| 62-290128 | of 1987 | Japan . |
| 62-33470 | of 1987 | Japan . |
| 62-355538 | of 1987 | Japan . |
| 62-43175 | of 1987 | Japan . |
| 62-43176 | of 1987 | Japan . |
| 62-7855 | of 1987 | Japan . |
| 62-143521 | of 1988 | Japan . |
| 63-164450 | of 1988 | Japan . |
| 63-164494 | of 1988 | Japan . |
| 63-181422 | of 1988 | Japan . |
| 63-308315 | of 1988 | Japan . |
| 63-36547 | of 1988 | Japan . |
| 63-46751 | of 1988 | Japan . |
| 63-9925 | of 1988 | Japan . |
| 62-244622 | of 1989 | Japan . |
| 2 104 290 | 8/1981 | United Kingdom . |
| WO 91/10261 | of 1991 | WIPO . |

OTHER PUBLICATIONS

Gargini, et al. "WOS: Low Resistance Self–Aligned Source, Drain and Gate Transistors" IEEE 1981, IEDM 81, pp. 54–57.

C.Y. Ting, et al., The Use of TiSi2 in a Self–Aligned Silicide Technology: Electromechanical Society Proceedings, v. 62–7, (1$^{st}$ Intn'l Symp. On VLSI in Detroit), 1982 pp. 224–231.

R.J. Schutz, "TiN as a Diffusion Barrier Between CoSi2 or PtSi and Aluminum" MRS Proceedings, 18, 1982, pp. 89–99.

T. Moriya, et al., A Planar Metallization Process–Its Application to Tri–level Aluminum Interconnection: IEEE, IEDM 83, 1983 pp. 550–553.

J.Y. Chen, et al., "Refractory Metals and Metal Silicides for VLSI Devices" Solid State Technology, Aug. 1984 pp. 145–149.

G. Higelin, et al., "A Contact Filling Process with CVD–Tungsten for Multilevel Metallization Systems" IEEE Cat. No. CH–2337–4, 1986, pp 443–449.

T. Ohba, et al., "Selective CVD Tungsten Silicide for VLSI Application" IEEE 1987, IEDM 87–213 pp. 213–215.

H. Kotani, et al., "A Highly Reliable Selective CVD–W Utilizing SiH4 Reductionfor VLSI Contacts" 1987 IEEE, CH 2515–5, IEDM 87–217, pp. 217–220.

K. Pauleau, "Interconnect Materials for VLSI Circuits" Solid State Technology, Apr. 1987, pp. 155–162.

V. Rana, et al., "Thin Layers of TiN and Al as Glue Layers for Blanket Tungsten Deposition" Materials Research Sol., Tungsten & Other Refractory Metals for VLSI Applications II, Proceeding of 1986 Workshop, Palo Alto, CA, Nov. 1986, pp. 187–195.

Jan–Otto Carlsson, et al., "Thermodynamic Investigation of Selective Tungsten Chemical Vapour Deposition: Influence of Growth Conditions and Gas Additives on the Selectivity in the Fluoride Process" Thin Solid Films, 158, 1988, pp. 107–122.

Y. Kusumoto, et al., "A New Approach to the Suppression of Tunneling" Materials Research Soc., 1988, Tungsten and Other Refractory Metals for VLSI Applications III, Proceedings of 1987 Workshop, pp. 103–109.

S.W. Sun. et al, Al1/W/TiNx/TiSiy/Si Barrier Technology for 1.0–um Cntacts" IEEE Election Device Letters, v. 9, #2, Feb. 1988, pp. 71–73.

R.S. Rosler, et al., "Tungsten Chemical Vapor Deposition Characteristics using SiH4 in a Single Wafer System" J. Vac. Soc. Technology, (6) Nov./Dec. 1988, pp. 1721–1727.

J.F. Shackelford, "Introduction to Materials Science for Engineers" Macmillan Pub. Co., 1988, pp. 302–307.

S.M. Rossnagel, et al., Lift–Off Magnetron Sputter Deposition: Abstract of Presentation by Stephen M. Rossnagel, Oct. 17, 1989, Amer. Vacuum Soc. Conference, 1 page.

C–K Hu, et al, "Copper–Polyimide Wiring Technology for VLSI Circuits" Materials Res. Soc. Symp. Proc. 1990, Tungsten and Other Advanced Metals for VLSI/ULSI Applications V. 1989 Workshop, pp. 369–373.

"Underlayer for Polycide Process" IBM TDB, v. 28, #9, Feb. 1988, pp. 3958–3969.

"Selective Tungsten Silicide Deposition" IBM TDB, v. 29, #5, Oct., '986, p. 2195.

"Cobalt Metallurgy for VLSI" IBM TDB, v. 29, #5, Oct. 1986, p. 2197.

"Tungsten–on–Conducting Nitride Composite Films" IBM TDB, v. 31, #3, Aug. 1988, p. 477.

"Etching Dielectric Materials for Copper Interconnects" IBM TDB, v. 32, #7, Dec. 1989, pp. 47–48.

Translation of Takeuchi et al., Japan Kokai Pub. #60–173857, 8 pages.

SEM of Liner Applied by Collimated Sputtering Prior to CVD of Tungsten

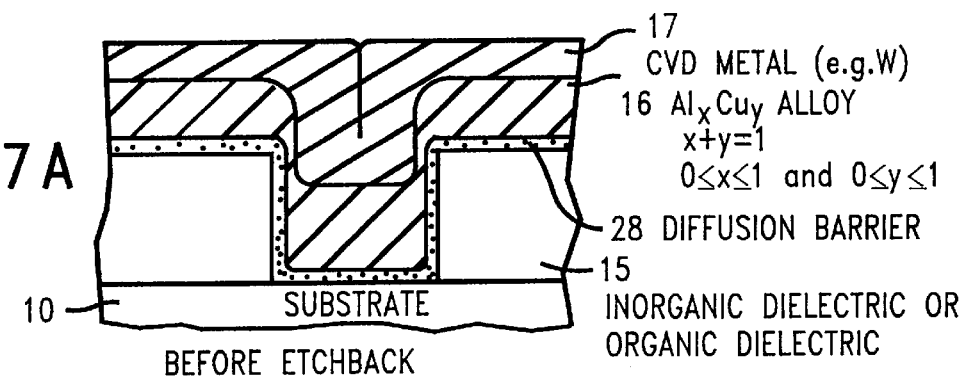
FIG. 7A — BEFORE ETCHBACK
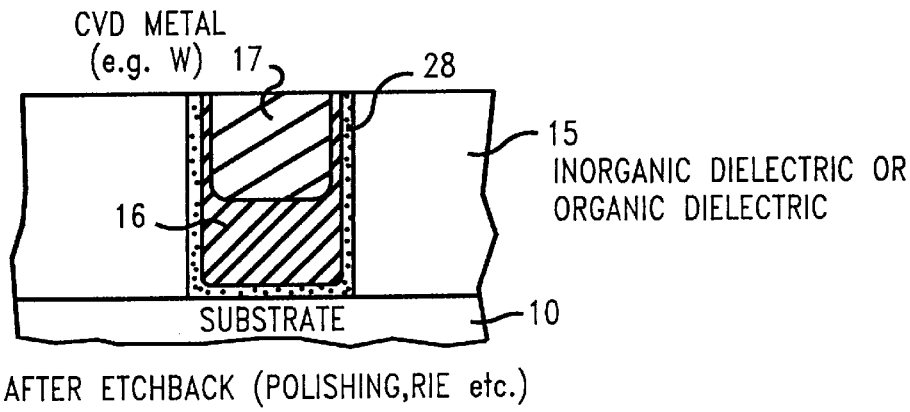
FIG. 7B — AFTER ETCHBACK (POLISHING, RIE etc.)
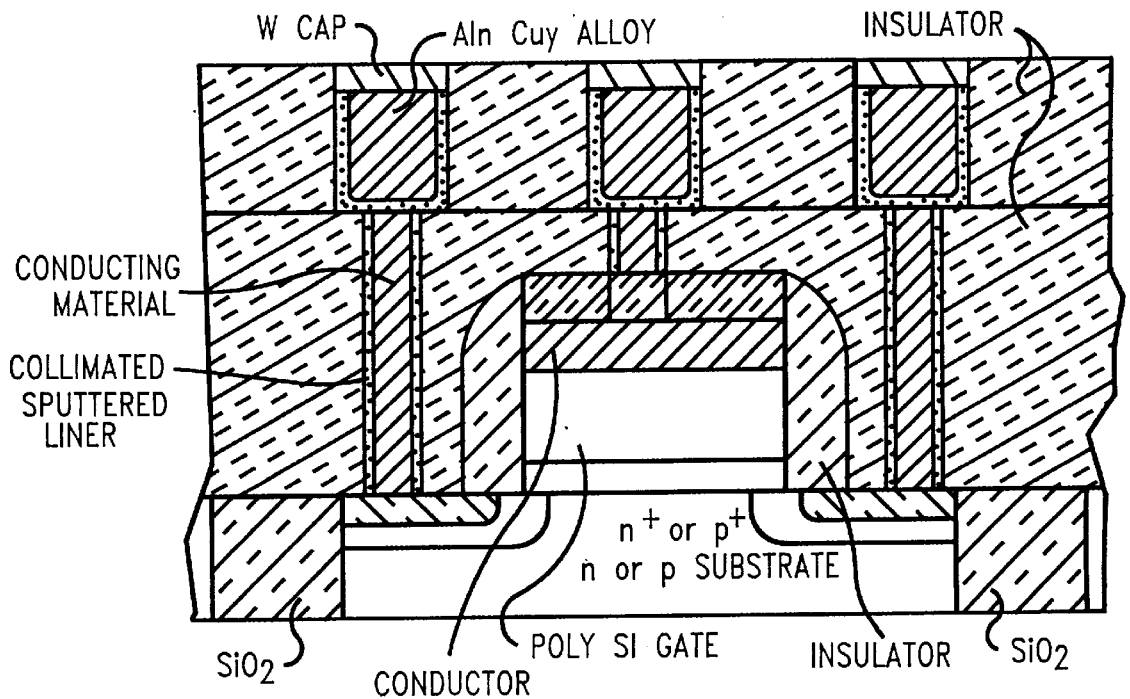
FIG. 8

REFRACTORY METAL CAPPED LOW RESISTIVITY METAL CONDUCTOR LINES AND VIAS

CROSS REFERENCE

This is a continuation of application No. 08/753,991 filed Dec. 3, 1996, now U.S. Pat. No. 5,889,328, which is a continuation of application No. 08/346,208 filed Nov. 22, 1994, now U.S. Pat. No. 5,585,673, which is a divisional of application No. 08/125,107 filed Sep. 21, 1993, now U.S. Pat. No. 5,426,330, which is a continuation of application No. 07/841,967 filed Feb. 26, 1992, now U.S. Pat. No. 5,300,813 and application No. 07/928,335 filed Aug. 12, 1992, now U.S. Pat. No. 5,403,779 which is a divisional of application No. 07/841,967.

BACKGROUND OF THE INVENTION

1. Field of the Invention

The present invention generally relates to the manufacture of electrical conductor lines and vias that interconnect circuits on substrates such as semiconductors and related packages and, more particularly, to a low cost method of filling seams or holes in substrates using a combination of a low resistivity metal deposited by physical vapor deposition (PVD) and a refractory metal deposited by chemical vapor deposition (CVD). The invention has particular application in submicron circuit manufacture.

2. Description of the Prior Art

Low resistivity metals such as aluminum and copper and their binary and ternary alloys have been widely explored as fine line interconnects in semiconductor manufacturing. Typical examples of fine line interconnect metals include $Al_xCu_y$, where the sum of x and y is equal to one and both x and y are greater than or equal to zero and less than or equal to one, ternary alloys such as Al—Pd—Cu and Al—Pd—Nb, Al—Cu—Si, and other similar low resistivity metal based alloys. Today's emphasis on scaling down line width dimensions in very large scale integrated (VLSI) circuitry manufacture has led to reliability problems including inadequate isolation, electromigration, and planarization.

The IBM Technical Disclosure Bulletin to Ahn et al., Vol. 33, No. 5, October 1990, pages 217–218, discloses tungsten wrapped copper conductors and via holes fabricated by selective deposition using a mixture of $WF_6$ and $SiH_4$ in the presence of hydrogen. Encapsulated interconnects like those of Ahn et al. have significantly higher resistance to electromigration and the small grain size of a selective tungsten film reduces reflectance and thereby enhances the ability of photolithography tools to focus and resolve photoresist images. However, the tungsten layer formed using the low temperatures described by Ahn et al. would be silicon rich (e.g., 3–4%) and would not be a good diffusion barrier for copper since copper resistivity would be degraded by the formation of copper silicide. Thus, it is difficult to deposit a diffusion barrier by selective means at low temperature. Moreover, the Ahn et al. technique relies on the formation of a donut shape at the bottom of the lines which is normally created by the reaction of outgassing moisture and $WF_6$. The creation of the donut shape is believed to be not reliable.

Dalton et al., *VMIC Conference*, Jun. 12–13, 1990, pages 289–292, points out that a hot wall CVD reaction involving $SiH_4$ and $H_2$ reduction of $WF_6$ to form a selective tungsten layer on an aluminum or alloy conductor results in the incorporation of fluorine at the aluminum and tungsten interface. The fluorine incorporation is a byproduct of the reaction of $WF_6$ with aluminum as shown by Equation 1.

$$WF_6 + 2Al \rightarrow 2AlF_3 + W \qquad \text{Eq. 1}$$

The thin layer of aluminum fluoride will increase the series contact resistance of Metal 1 to Metal 2 vias. Dalton reported that sputtering TiW film on top of the aluminum prior to tungsten encapsulation using CVD eliminates the problem of fluorine absorption.

Dalton discloses a traditional scheme for interconnect formation wherein aluminum is first deposited on a planar surface, it is overcoated with the sputtered TiW layer (the only difference from traditional processing), the aluminum is then patterned using photoresist imaging and developing followed by reactive ion etching (RIE). The resulting structure is then overcoated with a passivation dielectric such as $SiO_2$ or polyimide which itself is subsequently patterned, subjected to RIE, and metallized to create a multilayered structure. FIG. 1 is taken from Dalton and shows that multilayer devices produced by traditional processing schemes have seams in the dielectric layers at the location of the metal conductor lines and have a very irregular top surface.

It is difficult to achieve planarity of the dielectric using RIE. Planarity is in part dependent on the pattern density, and non-planar surfaces result in puddling problems during subsequent metalization. If an RIE technique is used on polyimide, an etch stop is needed for removal of photoresist on top of aluminum or copper based lines when the lines are etched down to the polyimide surface because the photoresist removal process would also remove polyimide. RIE of any high copper content, aluminum or copper alloy is extremely difficult. A serious drawback of traditional processes which include metal RIE is that a large number of metal shorts tend to develop with fine geometry due to particle defects.

U.S. Pat. No. 4,824,802 to Brown et al. discloses a method for filling interlevel dielectric vias or contact holes in multilevel VLSI metalization structures. In particular, an intermediary metal such as tungsten or molybdenum is either selectively deposited in openings in an insulator or non-selectively deposited over the entire surface and in the openings of the insulator by CVD, then a planarization resist, such as azoquinonenovolac-type resists, polymethacrylates, polyimides, or other thermoplastic materials, is applied over the top of the intermediary metal. A planarized structure is then obtained by etching to a level where the intermediary metal is even with the resist. The Brown et al. method does not avoid metal corrosion and other problems associated with etching and is not useful for planarizing Al—Cu or other soft alloys because they have different properties from the harder metals such as tungsten and molybdenum. Moreover, using the Brown et al. method, it is difficult to completely fill vias and lines.

U.S. Pat. No. 4,944,836 to Beyer et al. discloses a chemical-mechanical polishing technique which can be used to produce coplanar metal/insulator films on a substrate. In particular, Beyer et al. contemplate patterning an underlying insulating layer, depositing an Al—Cu film, and then using a chemical-mechanical polishing technique wherein an alumina slurry in dilute nitric acid is mechanically rubbed on the surface to remove Al—Cu. The polishing compound tends to have a significantly higher removal rate for Al—Cu than the underlying insulator. The resulting structure includes Al—Cu lines planarized with the insulating layer, and subsequent layers can easily be added in the fabrication of multilayer structures.

U.S. Pat. No. 4,956,313 to Cote et al. discloses a via filling and planarization technique wherein Al—Cu alloy lines are patterned on top of a first passivation layer on a substrate, the lines are overcoated with a second passivation layer which is preferably a doped glass such as phosphosilicate glass (PSG) or borophosphosilicate glass (BPSG) which conforms over the contours of the Al—Cu alloy lines, vias are then formed in the second passivation layer to expose the lines, and tungsten is applied over the surface of the second passivation layer and in the vias by CVD. It is reported in Cote et al. that CVD tungsten is conformal in character and can fill the vias without creating voids. The structure is then planarized by polishing with an abrasive slurry.

Neither Beyer et al. nor Cote et al. recognize that polishing is not practical for low resistivity, soft metals such as Al—Cu alloys. This is because such materials tend to scratch, smear on the surface, and corrode under the influence of the slurry. Moreover, creation of the planarized structures in accordance with Cote et al. takes several processing steps which increases costs and reduces output.

Rossnagel et al. *J. Vac. Sci. Technol.* 2:261 (March/April 1991) discloses a collimated magnetron sputter deposition technique for depositing films that are compatible with lift-off patterning techniques and hole filling. The technique is also presented in U.S. Pat. No. 4,824,544 which is herein incorporated by reference.

Shiozaki et al., *Abstracts of the 19th Conference on Solid State Devices and Materials*, discloses the use of selective tungsten deposition for hole filling on top of a high resistivity hard metal such as $MoSi_x$ and is unrelated to encapsulation of a soft metal.

SUMMARY OF THE INVENTION

It is therefore an object of the present invention to provide low-cost, corrosion-free, wear-resistant, electromigration resistant, electrical conductor interconnecting circuits on a substrate on a submicron scale using a method with a high process yield.

It is another object of the invention to provide a technique for inexpensively forming encapsulated fine electrical lines having particular application in the manufacture of submicron circuits without exposing the lines to RIE.

It is yet another object of the invention to provide a low resistivity line or via with a wear resistant, hard cap which reduces electromigration.

It is still another object of this invention to provide unique interconnect lines formed from PVD low resistivity metal encapsulated by CVD refractory metal.

It is still another object of this invention to provide a method for promoting adhesion of CVD tungsten in high aspect ratio vias or interconnect lines which includes providing a liner in the vias or interconnect lines formed from a refractory metal, or alloys or compounds thereof, prior to CVD tungsten.

According to the invention, a simple and cost effective technique is provided which results in electrical conductors that are corrosion-free and exhibit resistance to wear and electromigration, and has demonstrated high process yield. Most importantly, this technique avoids cumbersome dielectric planarization steps completely as the deposition takes place only on the planar surfaces to start with. The technique uses ordinary batch or single wafer PVD processes such as evaporation, sputtering or collimated sputtering followed by a conformal deposition of refractory metal.

BRIEF DESCRIPTION OF THE DRAWINGS

The foregoing and other objects, aspects and advantages will be better understood from the following detailed description of a preferred embodiment of the invention with reference to the drawings, in which:

FIGS. 7A and 7B are sequential cross-sectional side views of a semiconductor substrate illustrating yet another variation of the invention;

FIG. 8 is a cross-sectional view of an exemplary, multilevel, damascene structure wherein PVD $Al_xCu_y$ alloy is capped with CVD tungsten.

DETAILED DESCRIPTION OF A PREFERRED EMBODIMENT OF THE INVENTION

The invention is generally related to methods for forming metal filled vias and conductor lines on a substrate where the vias and conductor lines include a soft, low resistivity metal which is capped with a relatively hard, refractory metal which is resistant to corrosion, wear, and electromigration, and where the vias and conductor lines are planar with a dielectric layer coated on the substrate. Several different and novel structures are created according to the procedures described in conjunction with FIGS. 2A–E, FIGS. 4A–E, and FIGS. 7A–B, depending on the PVD deposition technique utilized. It should be understood that the techniques and resulting structures are not limited to using any specific substrates and dielectric overlays (e.g., composites of inorganic and organic layers like that shown in FIGS. 2A–E and 5A–E can be used as well as single layers of inorganic or organic insulator materials). Moreover, the invention is not restricted to any particular metal combinations; rather, an objective of the invention is to overlay a soft, low resistance metal or metal alloy with a hard refractory metal which can withstand wear, corrosion and electromigration. The invention has particular relevance to electrical systems which use aluminum and copper alloys since it has been discovered that uniform, conformal coatings of a refractory metal liner material can be deposited in submicron vias and trenches with reliable high aspect ratio filling using PVD collimated sputtering. The refractory metal liner will serve as an effective diffusion barrier to copper for subsequent processing.

Figure 2A:
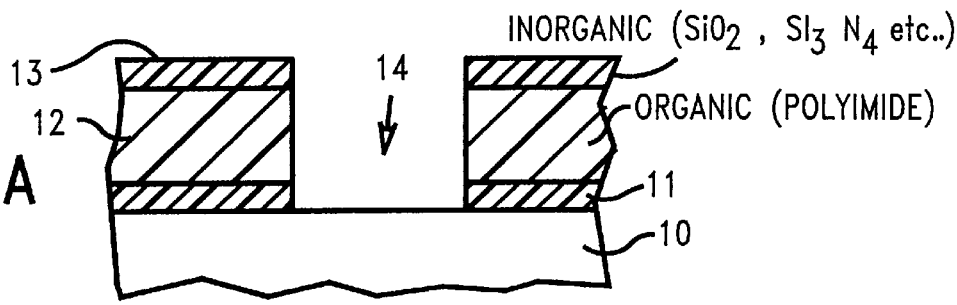
FIGS. 2A through 2E are sequential cross-sectional side views of a semiconductor substrate illustrating one variation of the invention.

With reference to FIG. 2A, a substrate 10 is first overcoated with a dielectric which is subsequently patterned. The substrate 10 is preferably silicon, gallium arsenide, or some other material which is suitable for making integrated circuits. However, the substrate 10 may be a ceramic, glass, or composite material commonly used for packaging semiconductors and for making thin film interconnections. The substrate 10 preferably has a plurality of semiconductor devices formed therein which may include field effect transistors (FETs), bipolar transistors, resistors, Schottky diodes, or the like. It should be understood that the substrate 10 shown in each of FIGS. 3A–B, 4A–E, 5A–E, 7A–B, and 8, can have any of the attributes discussed above plus many other attributes known within the art.

The dielectric composite shown in FIG. 2A includes top and bottom inorganic dielectric layers 13 and 11, respectively, which may be silicon dioxide ($SiO_2$), silicon nitride ($Si_3N_4$), or the like. The inorganic layers 11 and 13 are both preferably deposited using plasma enhanced chemical vapor deposition (PECVD) where $SiO_2$ is first deposited at 90 Torr on the conducting substrate 10 and $Si_3N_4$ (0.075 to 0.1 $\mu$m) is provided as a barrier against mobile ion diffusion. A thicker organic dielectric layer 12, such as a polyimide, is deposited between the inorganic layers 11 and 13. Alternative to the dielectric composite created by layers 11, 12, and 13, a single layer of an inorganic dielectric, such as $SiO_2$, PSG, or BPSG, or an organic dielectric, such as polyimide, may also be employed and may be deposited by any of a number of well known techniques such as by growing in an oxidative atmosphere, sputtering, or PECVD. While FIGS. 2A–E and 5A–E show the use of the composite structure and FIGS. 3A–B, 4A–E, and 7A–B show the use of a single inorganic or dielectric layer, it should be understood that the dielectric layer is not limiting to the practice of this invention and that any dielectric (e.g., inorganic or organic) used by itself or in combination could be employed in the practice of this invention.

FIG. 2A shows an opening 14 formed in the dielectric composite, and this opening may be a via or a trench for a conductive line. In VLSI applications, the substrate 10 is likely to have several hundred to thousands of openings 14 like that shown in FIG. 2A where the resulting dense, complex pattern will ultimately interconnect circuits on or in the substrate. The openings 14 are preferably formed using contrast enhanced lithography (CEL) followed by trench or hole etching with a multiwafer tool using $CHF_3$ and $O_2$ with an optimum overetch to ensure that the opening 14 has the desired dimensions and extends to a contact on the surface of the substrate 10 for a via stud pattern. For line patterns, the dielectric layers are preferably partially etched to a depth about 10% higher than the metal thickness to be employed. When etching polyimide 12, $O_2$ RIE at low temperatures is preferred. It should be understood that the formation of the opening 14, as indicated in FIGS. 2A–E, 4A–E, 5A–E, and 7A–B, is well understood within the art and can be created by many different techniques.

Figure 1:
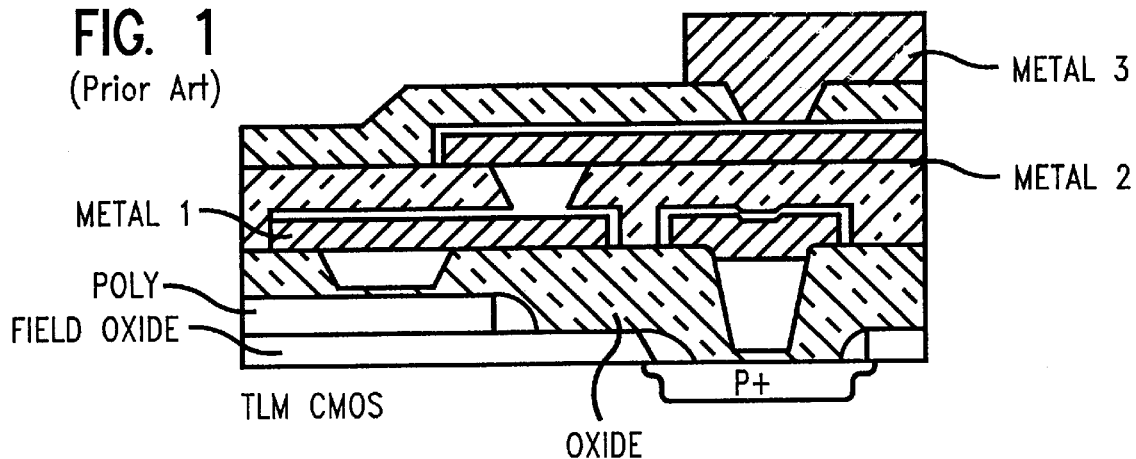
FIG. 1 is a cross-sectional side view of a prior art semiconductor substrate showing an uneven top surface.
Figure 3A:
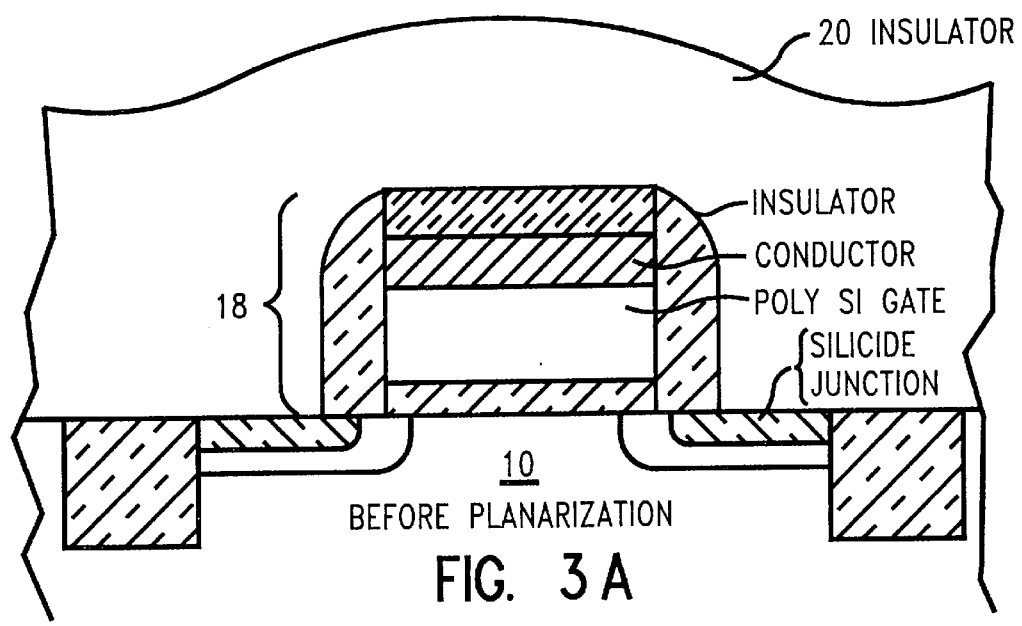
FIGS. 3A and 3B are sequential cross-sectional side views of a substrate with a device thereon overcoated by an insulator being planarized prior to patterning the insulator.
Figure 3B:
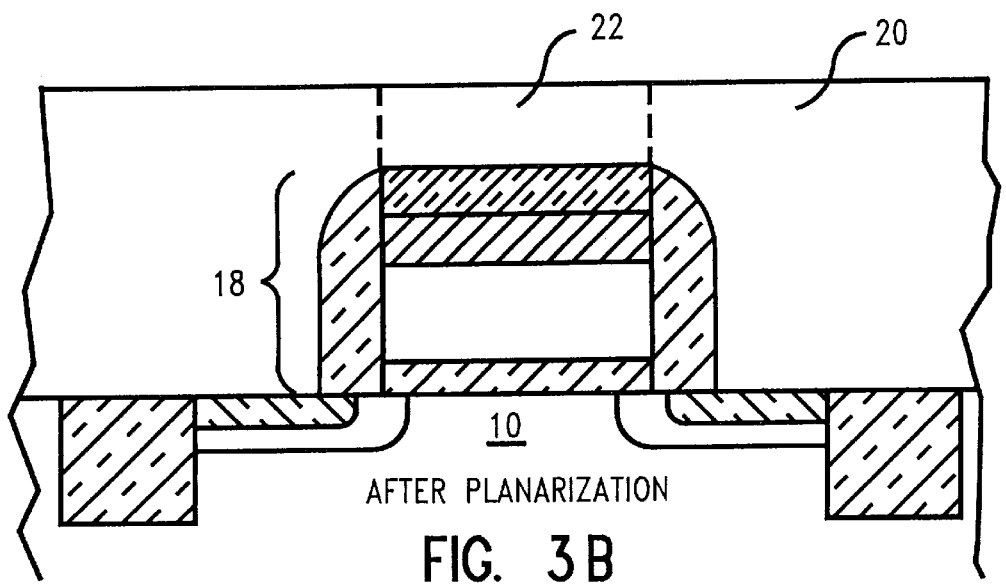

If the starting substrate 10 has a device 18 formed thereon as is shown in FIGS. 3A and 3B, as opposed to the flat substrate 10 with no upwardly protruding devices as is shown in FIG. 2A, the insulator 20 coated over the device 18 should first be planarized before an opening 22 is created. Planarization can be achieved by RIE, chemical-mechanical polishing, a combination of both RIE and chemical-mechanical polishing, or by other means.

Figure 2B:
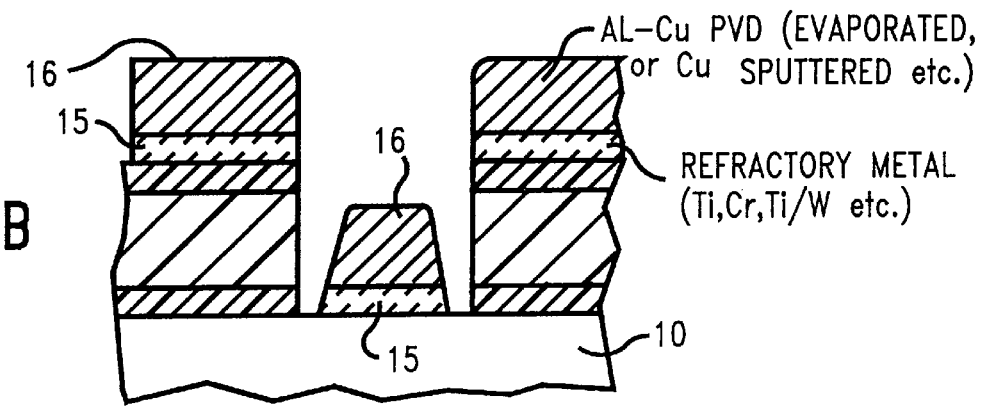

FIGS. 2B–2E illustrate a first variation of the present invention wherein a planar patterned structure, which can be either the one shown in FIG. 2A or the one shown in FIG. 3B or any other structure which has an opening 14 formed in an overcoated dielectric, then has a refractory metal layer 15 deposited over the inorganic dielectric layer 13 and on the exposed substrate 10 at the bottom of gap 14. This is accomplished using an evaporation PVD technique best described in *Handbook of Thin Film Technology*, eds. Maissel and Glen, McGraw-Hill Co., 1983, pp. 1–100. An important feature of employing evaporation PVD at this point is that the refractory metal layer 15 does not coat the side walls of the opening 14 in the dielectric. It should be understood that PVD collimated sputtering, similar to that described in U.S. Pat. No. 4,824,544, can be used in the practice of the invention, but that collimated sputtering produces a conformal layer which would coat the side walls of opening 14, contrary to that which is shown in FIG. 2B. The use of collimated sputtering to create a refractory metal liner is discussed in more detail below. The refractory metal may be titanium (Ti), titanium alloys or compounds such as Ti/TiN, tungsten (W), titanium/tungsten (Ti/W) alloys, or chromium (Cr) or tantalum (Ta) and their alloys, or some other suitable material. If copper based lines or vias are to be formed, a refractory metal should be used which can act as a diffusion barrier to copper such that diffusion during subsequent processing of deposited copper in the opening 14 into the substrate 10 is prevented.

Next, a single, binary or ternary metalization 16 is deposited over the refractory metal 15 by PVD using evaporation. Again, since evaporation is used, the side walls of opening 14 are not coated. However, it should be understood that the metalization 16 could be applied by collimated sputtering, in which case a conformal coating of the metalization within the opening 14 and on top of the dielectric stack. Preferably, the metalization is $Al_xCu_y$, where the sum of x and y is equal to one and both x and y are greater than or equal to zero and less than or equal to one; however, ternary alloys such as Al—Pd—Cu and multicomponent alloys such as Al—Pd—Nb—Au would also be suitable. The principal characteristic of the metalization 16 is that it is a low resistivity and soft material compared to the refractory metal 15. Preferably, the opening 14, which represents the line pattern or interlevel via pattern, is filled with the metalization 16 to a depth of 100 to 400 nm below the surface of the line or via. It should be understood that the metalization 16 shown in FIGS. 4A–E, 5A–E, and 7A–B would be of the same sort described above.

Figure 2C:
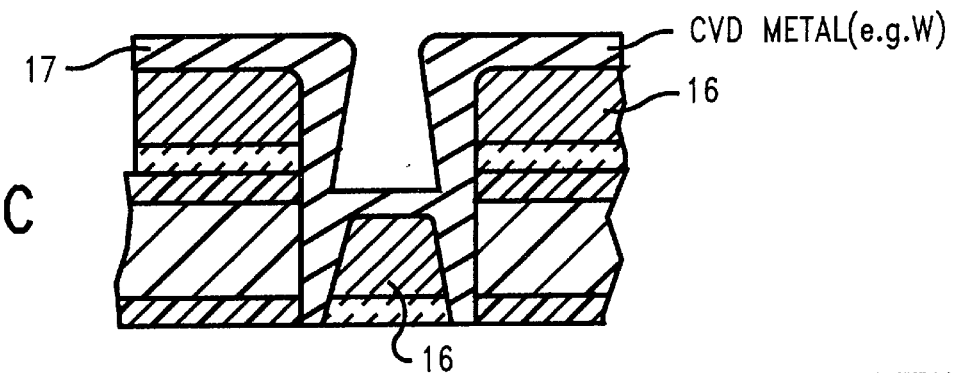

FIG. 2C shows a refractory metal 17, such as tungsten, cobalt, nickel, molybdenum, or alloys/compounds such as Ti/TiN, deposited over the structure. Deposition of the refractory metal 17 may be by one step CVD or by a two step process, as is best explained in FIGS. 4a–e, wherein the first step involves collimated sputtering or the like of an adhesion promoting compound such as titanium or titanium nitride to create a conformal blanket coating, and the second step includes depositing a thin CVD layer of tungsten to achieve a higher degree of conformality. CVD deposition of the refractory metal is preferably achieved with $SiH_4$ or $H_2$ reduction of $WF_6$. A particularly preferred CVD procedure involves $SiH_4$ reduction of $WF_6$ followed by $H_2$ reduction of $WF_6$ because, on top of a TiN layer, CVD of tungsten proceeds smoothly with $SiH_4$ reduction of $WF_6$, but not with $H_2$ reduction. The refractory metal 17 provides a wear resistant, corrosion resistant, and electromigration resistant coating to the underlying soft, low resistivity metalization 16 in opening 14. A particularly good advantage to using CVD with $SiH_4$ reduction of $WF_6$ is that the ratio of $SiH_4$ to $WF_6$ can be varied to incorporate different amounts of silicon into the tungsten to achieve beneficial properties. For example, it would be preferable to deposit the refractory metal 17 at a 0.5 $SiH_4$ to $WF_6$ ratio while the opening 14 in the dielectric is being filled since so doing will result in a lower resistance refractory metal; however, towards the top surface of the dielectric to deposit at a 2.0 $SiH_4$ to $WF_6$ ratio is preferable since this will result in more silicon incorporation which has greater wear resistance. Using the above-described CVD technique, the silicon doped tungsten can be used as a wear resistant coating or a polishing stop (e.g., it will be more resistant to an alumina slurry in ferric nitrate used in chemical-mechanical polishing). Because the metalization 16 applied by evaporation does not coat the side walls of the opening 14, the CVD applied refractory metal 17 creates tapering side walls around the metalization 16 and the metalization 16 becomes completely encapsulated in refractory metal 17 and underlying refractory metal 15.

Figure 2D:
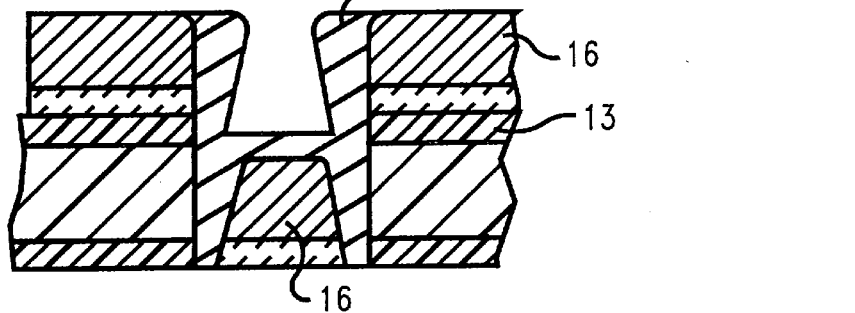
Figure 2E:
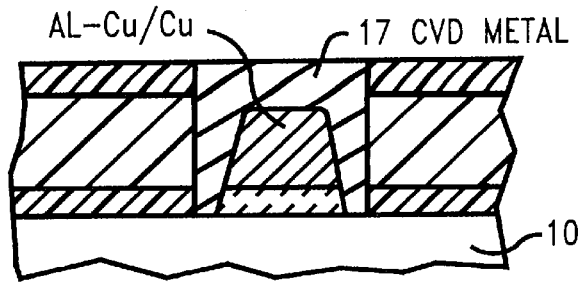

FIGS. 2D and 2E show that the structure is planarized after the CVD application of the refractory metal 17 to yield a structure wherein a two part conductive via or line, which includes a central, soft, low resistivity metalization 16, encapsulated in a hard, wear resistant refractory metal 17, has a top surface which is even with the top surface of the dielectric composite on substrate 10. Planarization can be accomplished in one or two steps by chemical-mechanical polishing with a slurry such as alumina in dilute ferric nitrate or by RIE in the presence of $SF_6$ or $Cl_2$ based chemistry. If chemical-mechanical polishing is employed, slurries can be selected to remove different metal layers on the stack. For example, Ti/TiN/W on top of copper can be removed using the alumina in dilute ferric nitrate slurry, and then the remaining copper can be removed by switching to a slurry without alumina. Combinations of RIE removal of the refractory metal layer 17 followed by chemical-mechanical polishing of the remaining metalization 16 and remaining refractory metal 17 above the top organic or inorganic layer 13 are also contemplated. A particular planarization procedure contemplated includes removing tungsten refractory metal 17 by either chemical-mechanical polishing or RIE with $SF_6$ or $Cl_2$ based chemistry down to an Al—Cu alloy metalization 16 surface as shown in FIG. 2D, then, using the tungsten as a mask, the Al—Cu CVD layer is etched down to the inorganic layer 13 surface, and finally, the remaining tungsten 17 on the dielectric surface is either polished, wet etched or RIE etched in $Cl_2$ to yield the structure shown in FIG. 2E.

Figure 4A:
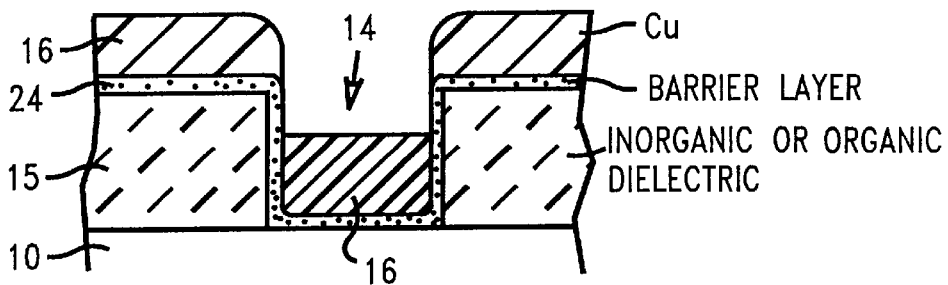
FIGS. 4A through 4E are sequential cross-sectional side views of a semiconductor substrate illustrating another variation of the invention.
Figure 4B:
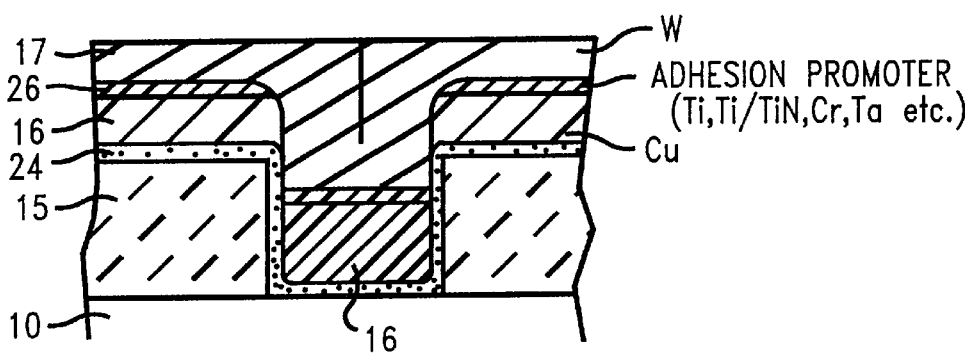

FIGS. 4A through 4E show another variation on the invention where like elements to those identified above are indicated by the same numerals in each of the Figures. As shown in FIG. 4A, copper metalization 16 is deposited in an opening 14 created in an inorganic or organic dielectric 15 formed on substrate 10. The chief difference between the structure shown in FIG. 4A and the structure shown in FIG. 2B is that prior to deposition of copper metalization, a thin layer of refractory metal 24 such as titanium, titanium nitride (TiN), tungsten, tantalum, or alloys and compounds thereof, is deposited over the inorganic or organic dielectric 15 surface and inside the opening 14 via collimated sputtering.

As noted above, collimated sputtering is generally described in U.S. Pat. No. 4,824,544 to Rossnagel et al. where a lift-off procedure is discussed. In the present invention, it has been discovered that employing collimated sputtering at higher pressures where scattering dominates, as opposed to lower pressures where directional deposition dominates, allows for the creation of conformal coatings within a high aspect ratio, submicron level trench or via (e.g., both the side walls and base are coated). The aspect ratio generally refers to the ratio of the height of a trench or via relative to its width in the case of a trench or its diameter in the case of a via. Trenches and vias with aspect ratios greater than two are generally considered to have a high aspect ratio. With collimated sputtering, scattering tends to dominate above pressures of 1 mTorr (preferably around 3 mTorr), while directional deposition dominates below 1 mTorr. Collimated sputtering is described in more detail below in conjunction with FIGS. 5A–E and 6.

Completely coating the bottom surface and side walls of opening 14 with a refractory metal layer 24, as shown in FIG. 4a, is especially important when a copper based alloy metalization 16 is used since copper will diffuse into the substrate 10 during subsequent high temperature processing and ruin the device if no diffusion barrier is provided. The copper metalization 16 can be deposited by PVD using either evaporation or collimated sputtering or by other techniques. When submicron, high aspect ratio holes are to be filled, prior art CVD techniques have been unsuccessful for filling the holes with aluminum and copper based alloys; therefore, the preferred method for filling is by PVD techniques.

Subsequent to deposition of metalization 16, a thin layer 26 of titanium, Ti/TiN, tantalum or chromium is then applied over the copper metalization 16 surface to promote adhesion. A refractory metal such as tungsten is then deposited by CVD by $SiH_4$ or $H_2$ reduction of $WF_6$ to yield the structure shown in FIG. 4B. As explained above, varying the $SiH_4$ to $WF_6$ ratio during CVD can advantageously be used to make a harder, more wear resistant, tungsten with incorporated silicon layer near the top surface of the dielectric 15. The interfacial thin layer 26 should be chosen so that it does not attack the underlying copper metalization 16.

Figure 4C:
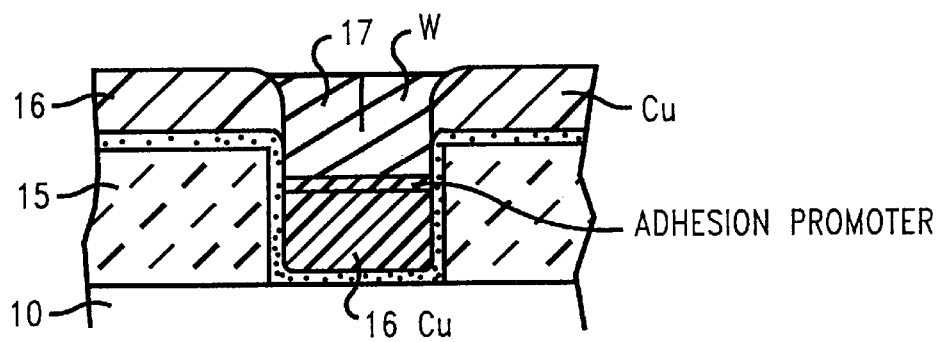
Figure 4D:
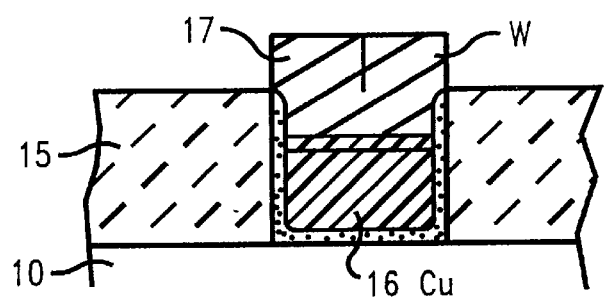
Figure 4E:
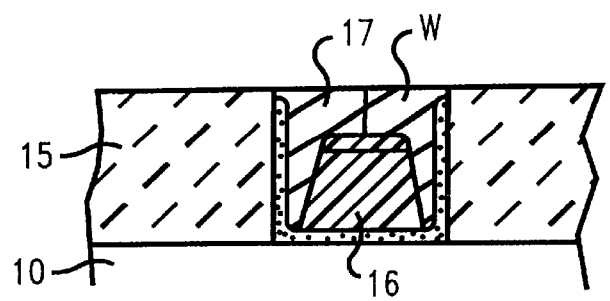

FIG. 4c shows that first tungsten is planarized by polishing or by RIE and FIG. 4d shows that copper is selectively removed by wet etching. When copper or copper alloy lines are being created, it is advantageous to use a wet etch solution based on hydrogen peroxide ($H_2O_2$) and hydrogen tetroxide ($H_2O_4$) to planarize the copper. At room temperature, this type of solution will not etch tungsten or dielectric, but will etch off all copper positioned above the dielectric since it is not protected from the wet etch solution (e.g., at room temperature, $H_2O_2$ has almost infinite selectivity). FIG. 4e shows that after the wet etch, the tungsten 17 can be selectively removed by RIE, polishing or other techniques. A preferred method for removing the tungsten refractory metal 17 which projects above the dielectric 15 surface is by chemical-mechanical polishing using an alumina in ferric nitrate slurry or the like. Because tungsten is a relatively hard material, it does not scratch or corrode when subjected to chemical-mechanical polishing. Rather than the three step approach discussed above, it may be preferable to remove the tungsten refractory metal 17, the thin layer 26 adhesion promoter, and the copper metalization 16 located above the surface of the insulator 15 in one step using chemical-mechanical polishing.

Figure 5A:
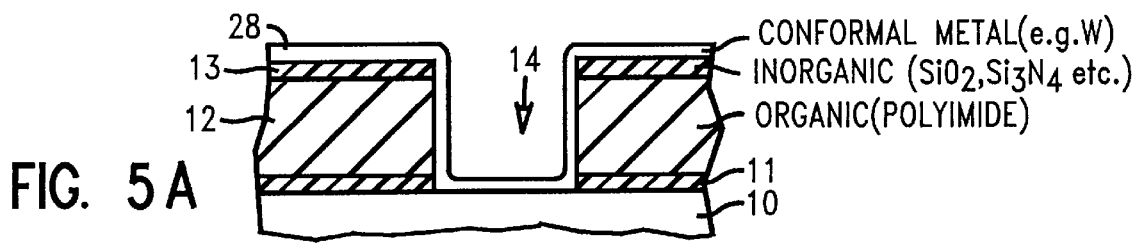
FIG. 5A through 5E are sequential cross-sectional side views of a semiconductor substrate illustrating still another variation of the invention.

FIGS. 5A through 5E show yet another variation on the invention where like numerals indicate like elements. FIG. 5A shows a refractory metal liner 28 is deposited in the opening 14 prior to metalization in a fully or partially conformal manner using collimated sputtering like that described in Rossnagel et al. *J. Vac. Sci. Technol.* 2:261 (March/April 1991) and U.S. Pat. No. 4,824,544 to Rossnagel et al. which are herein incorporated by reference. In collimated sputtering, refractory metal atoms are passed through a honeycomb like structure with an aspect ratio of depth to area of greater than one at pressures greater than 0.5 mTorr. Table 1 presents conditions which have been used for liner deposition.

TABLE 1

DEPOSITION OF LINER BY COLLIMATION

| ASPECT RATIO | STEP COVERAGE SIDEWALL/TOP (%) | BOTTOM/TOP (%) |
|---|---|---|
| 1:1 | 38 | 60 |
| 1:2 | 39 | 70 |
| 1:4 | 42 | 100 |
| NO COLLIMATION | | |
| 0 | 10 | 12 |

In the investigations presented in Table 1, the pressure was varied from 0.5 mT to 15 mT and the power was varied from 0.5 kW to 12 kW. Table 1 clearly indicates poor step coverage when collimation is not employed. Using higher pressures (e.g., 3 mTorr) and a collimator with aspect ratios of at least 1:1, the vias or contacts with aspect ratios of more 7 to 8 were coated with Ti/TiN or Ti/W bilayers resulting in step coverage more than 40% at the bottom and more than 30% on the side wall. This is a significant advance in the art since it allows semiconductor manufacturers to provide a conformal layer within a high aspect ratio trench or via which will promote adhesion of CVD tungsten. Moreover, as will be discussed in more detail below, providing a conformal layer of TiN or other suitable materials will provide an effective diffusion barrier for copper based alloys. As discussed above, in order to thoroughly coat the side walls and bottom of a trench or via pressures should be employed where scattering deposition dominates (e.g., above 1 mTorr) rather than at lower pressures where directional deposition dominates.

Figure 6:
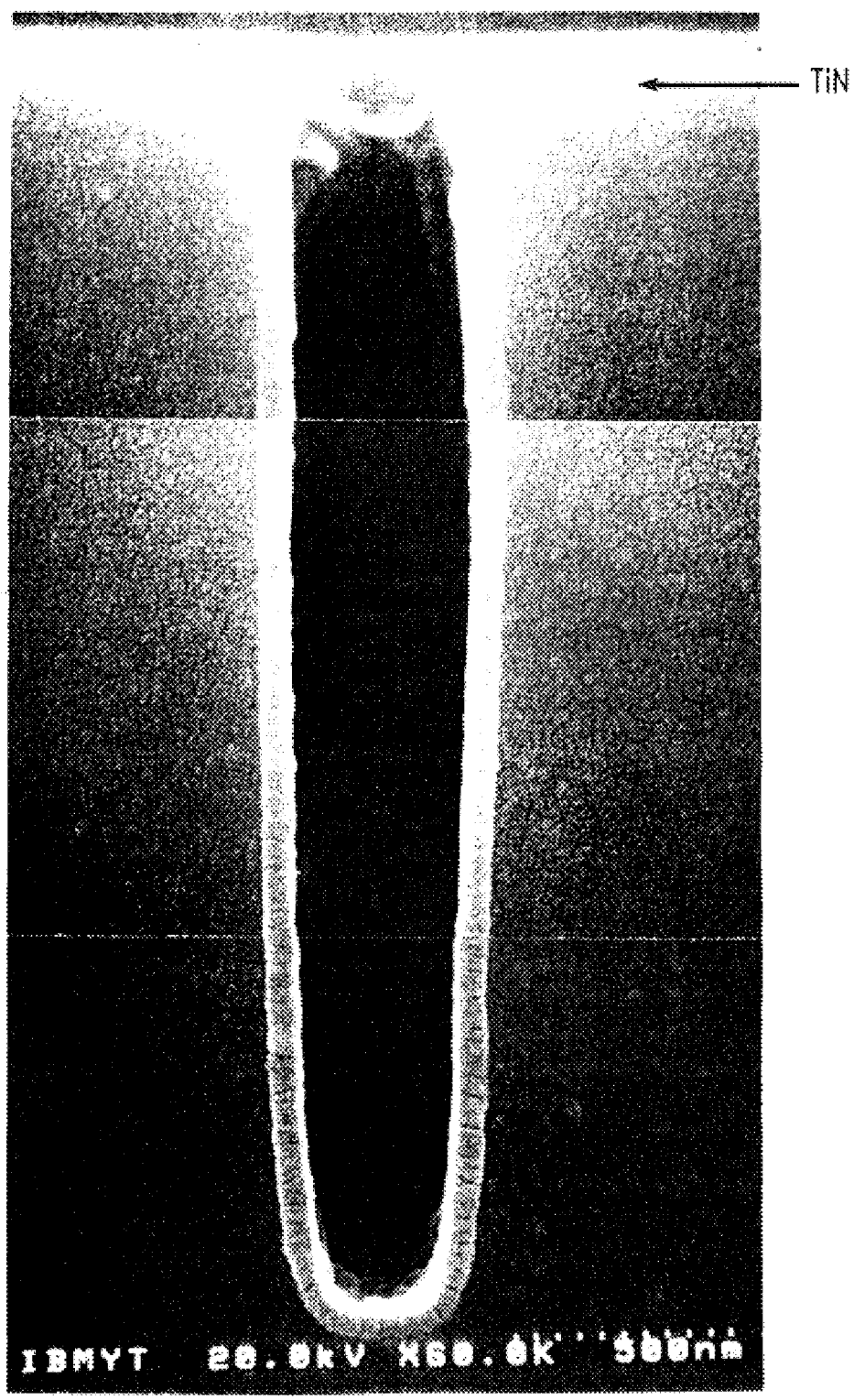
FIG. 6 is a scanning electron micrograph (SEM) of a liner deposited in a via using PVD.

FIG. 6 presents an SEM micrograph of a refractory metal liner in a via created by PVD collimated sputtering as described above. FIG. 6 shows that complete coverage of the bottom and sidewalls of the via can be obtained. To deposit TiN in-situ, $N_2$ plasma was used along with argon in the presence of a titanium target. The liner can improve adhesion and prevent any attack of CVD tungsten on the underlying substrate. The conformality of a liner increase when the aspect ratio of the collimator increases.

When copper lines or vias are to be employed in the structure, a robust liner which can serve as a diffusion barrier is required. Low pressure collimation of a refractory liner (e.g., Ta, Ti/TiN, or Ti/W, etc.) created a porous structure on the side wall of the opening 14 in the dielectric. To prevent this porous structure and provide a dense structure on the side wall, a two step collimation process was employed. Specifically, in the first step, a thin liner was deposited using a pressure below 0.8 mT to get bottom coverage of more than 60%, and in the second step, the pressure was increased in-situ to 3 to 4 mT to get a dense microstructure on the sidewall using the same collimator. Prior to this invention, there was no means available for forming a liner in high aspect ratio, submicron holes, especially at low temperatures. The results were similar for Ti/W and Ti/TiN bilayer liners used as a diffusion barrier for CVD refractory metal 17 or low resistivity soft metal.

Figure 5B:
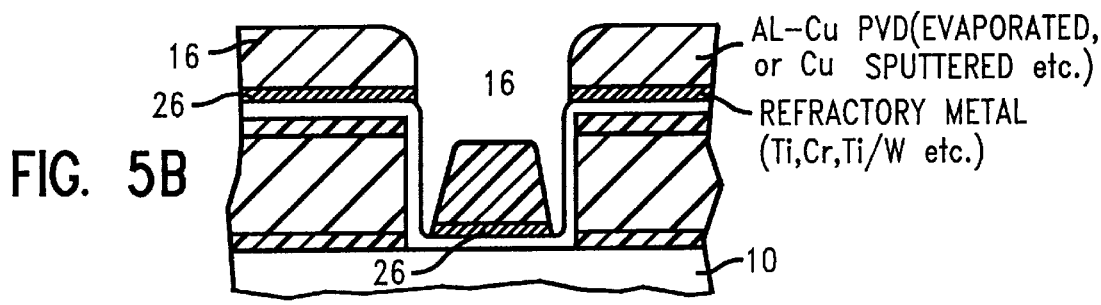
Figure 5C:
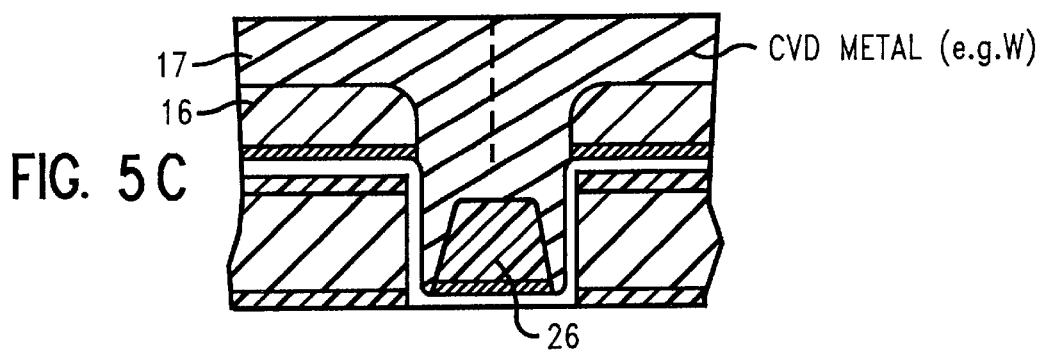
Figure 5D:
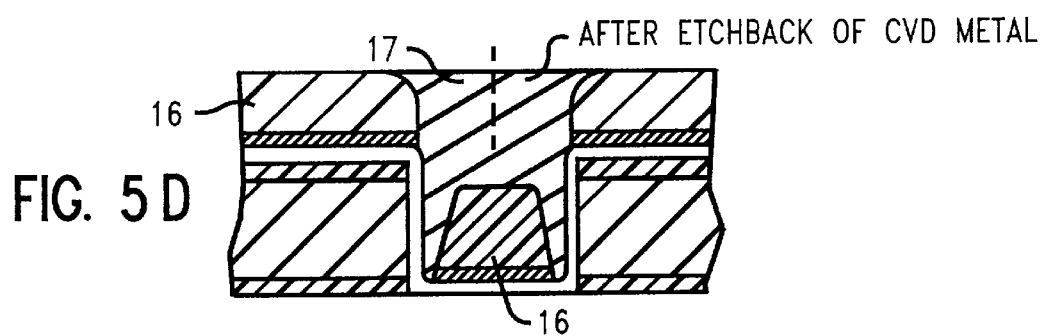
Figure 5E:
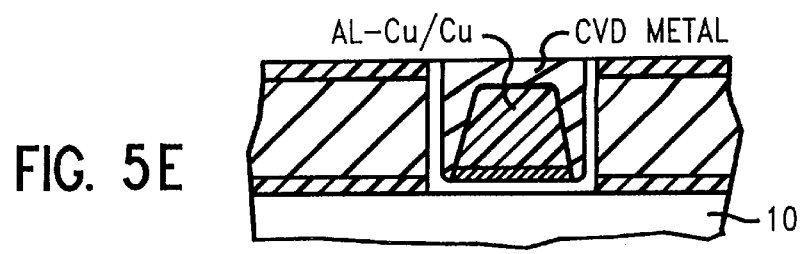

FIGS. 5B–E show similar steps to those shown in FIGS. 2B–E and FIGS. 4A–E are performed in another variation on the invention. Like in FIG. 4A, FIG. 5B shows that an adhesion promoter layer 26, such as Ti, Cr, Ta, Ti/W, or the like, is deposited by PVD evaporation over the top of the refractory metal liner and in the bottom of the gap 14. Like in FIG. 2B, FIG. 5B shows Al—Cu alloy or other metalization 16 being deposited by PVD evaporation techniques to a level 100 to 400 nm below the surface of the dielectric. FIGS. 5C–E respectively show deposition of a conformal layer of tungsten or other refractory material to cap the low resistivity metalization 16, planarizing the tungsten by RIE or polishing, or the like, and planarizing the structure using the two step wet etching of the aluminum-copper alloy with $H_2O_2$ followed by chemical-mechanical polishing of tungsten as shown in FIGS. 4c and 4d or simply. planarizing by one step RIE or chemical-mechanical polishing. For one step chemical-mechanical polishing, a slurry similar to that used for tungsten polishing can be used. Like the structure shown in FIG. 2E, the structure shown in FIG. 5E has a CVD refractory metal 17 encapsulating a low resistivity metalization 16 where there is a tapered refractory metal 17 region.

FIGS. 7A and 7B show yet another variation on the invention where like elements are indicated by like numerals. As shown in FIG. 7A, both a conformal, preferably refractory metal, liner/diffusion barrier 28 and a conformal $Al_xCu_y$ or other suitable, low resistivity alloy or metalization 16 layer are deposited in the opening in the organic or inorganic dielectric 15 on substrate 10 using PVD collimated sputtering procedures. Subsequently, a refractory metal 17 capping layer, such as tungsten, titanium, tantalum, or the like, is deposited by CVD to blanket coat the structure. FIG. 7B shows that the structure is then planarized using RIE, chemical-mechanical polishing, or by other techniques. Contrasting the structure of FIG. 7B with the structure of FIG. 5E, it can be seen that the shape of the via or line is quite different. While both structures include a low resistivity metal 16 capped by a refractory metal 17, the two metalizations will likely serve different environments.

Experimental tests have been conducted with the refractory metal capped lines fabricated according to the techniques discussed above. In the experiments, the line lengths varied from 13.5 cm to 50 cm with an area of the chip close to 1.6 mm$^2$. The metal pitches varied from 1 $\mu$m to 2 $\mu$m. The aspect ratio of the holes filled were from 2 to 8 and for lines 2 to 4. Table 2 presents the resistance test results.

TABLE 2

LINE RESISTANCE OF TUNGSTEN CAPPED LOW RESISTIVITY METAL AFTER POLISHING[a]

| Structure | Resistance before W dep. | Resistance after W dep. | Yield |
|---|---|---|---|
| (A) CREATED USING EVAPORATION[b] | | | |
| Ti(20 nm)/TiN(35 nm)/ Al—Cu(800 nm)/W(200 nm) | 0.042 | 0.04 | 95% |
| Ti(20 nm)/Al—Cu(800 nm)/ W(200 nm) | 0.042 | 0.052 | 95% |
| Ti(20 nm)/Al—Cu(800 nm)/ Ti(20 nm)/W(200 nm) | 0.042 | 0.054 | 94% |
| Ti(20 nm)/TiN(25 nm)/ CVD W(30 nm)/ Al—Cu(1300 nm)/W(200 nm) | 0.025 | 0.023 | 97% |
| Ti(50 nm)/TiN(25 nm)/Ti(20 nm)/ Al—Cu(1300 nm)/Ti(20 nm)/ TiN(20 nm)/W(200 nm) | 0.025 | 0.032 | 96% |
| Ti(50 nm)/TiN(50 nm)/Ti(50 nm)/ Al—Cu(600 nm)/Ti(20 nm)/ Cu(700 nm)/Ti(20 nm)/ TiN(20 nm)/CVD W(200 nm) | 0.023 | 0.021 | 100% |
| (B) CREATED USING COLLIMATED SPUTTERING[c] | | | |
| Ti(20 nm)/TiN(35 nm)/ Al—Cu(800 nm)/CVD W(200 nm) | 0.042 | 0.04 | 84% |
| Ti(20 nm)/Al—Cu(800 nm)/ CVD W(200 nm) | 0.042 | 0.05 | 81% |

TABLE 2-continued

LINE RESISTANCE OF TUNGSTEN CAPPED LOW RESISTIVITY METAL AFTER POLISHING[a]

| Structure | Resistance before W dep. | Resistance after W dep. | Yield |
|---|---|---|---|
| Ti(20 nm)/W(20 nm)/ Al—Cu(800 nm)/CVD W(200 nm) | 0.040 | 0.039 | 85% |
| Ti(20 nm)/TiN(75 nm)/ Cu(800 nm)/Ti(20 nm)/ TiN(25 nm)/CVD W(200 nm) | 0.024 | 0.022 | 80% |
| (C) CREATED USING SPUTTERING WITHOUT COLLIMATION[d] | | | |
| Ti(20 nm)/TiN(35 nm)/ Al—Cu(800 nm)/CVD W(200 nm) | 0.040 | 0.04 | 86% |

The results in Table 2 show that the process yield for the new technique is very good and that the line resistance is not altered greatly by the presence of the tungsten cap. Some of the above data shows an increase in resistance when titanium is present directly under Al—Cu alloy. This is due to the formation of $TiAl_3$ at the interface. It has been found that providing a titanium alloy or compound (e.g., TiN) between titanium and the aluminum-copper layer prevents the formation of $TiAl_3$ and thereby keeps the resistance lower. The bottom entry in Table 2 shows that if sputtering without collimation is employed, the sputtering should take place at lower pressures (e.g., below 1 mTorr) and be directionally dominated.

[a]In all the experiments, the line lengths varied from 13.5 to 50 cm with an area of the chip close to 1.6 $mm^2$. The metal pitches varied from 1 $\mu m$ to 2 $\mu m$. The aspect ratio of the holes filled were from 2 to 8 and for lines, 2 to 4.
[b]In the Evaporation Experiments, Ti/TiN bilayers were deposited by collimation sputtering.
[c]Colimation aspect ratio of 1:1.
[d]Sputtering pressure ranged between 0.5 to 0.8 mTorr.

It is anticipated that performing RIE or a wet etch using $H_2O_2$ or $H_2O_4$ on the refractory metal cap after chemical-mechanical polishing will be advantageous in bringing the thickness of the capping layer down to a bare minimum. A thick layer of a refractory metal would increase capacitance, which is not desirable. By allowing for a post-polishing wet etch or RIE procedure (e.g., $SF_6$ etching), the semiconductor designer will be able to use thick layers of refractory metal to provide maximum protection for the underlying low resistivity Al—Cu line or via during chemical-mechanical polishing, yet will be able to subsequently remove any excess refractory metal to achieve a structure which has very little overlying refractory metal. For example, a 500–600 nm thick refractory layer can be applied and used for protection against polishing damage, and then the refractory layer can be reduced down to a 50 nm thick layer by wet etching or RIE.

FIG. 8 shows an example of one multilevel semiconductor device which includes a top surface having tungsten capped $Al_xCu_y$ alloy lines flush with the top most insulator layer. As discussed in detail above, the vias or trenches with CVD tungsten preferably include a TiN liner formed by collimated sputtering to promote adhesion. Many other semiconductor devices can be fabricated within the practice of this invention.

Figure 9A:
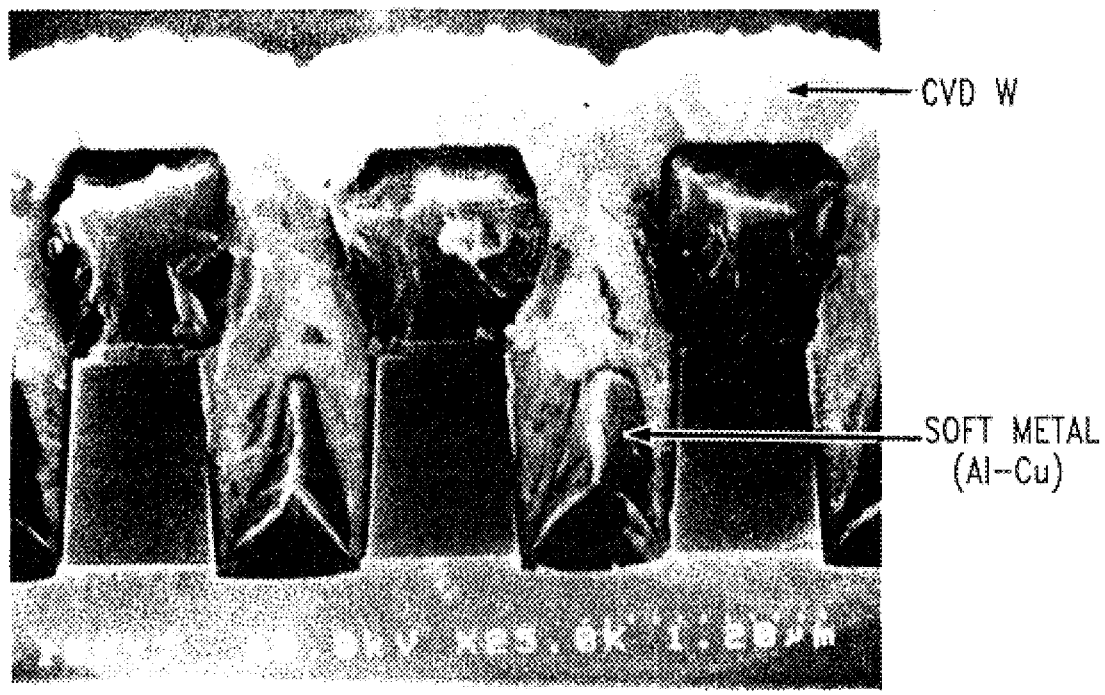
FIGS. 9A and 9B are cross-sectional SEM micrographs of structures with tungsten capped Al—Cu alloy lines prior to and after chemical-mechanical polishing, respectively.
Figure 9B:

FIGS. 9a and 9b are SEM micrographs of a cross-section of a semiconductor device. FIG. 9a shows separated $SiO_2$ portions projecting up from a silicon surface with Al—Cu alloy between and on top of the $SiO_2$. Between and on top of the Al—Cu alloy is a CVD tungsten layer. FIG. 9a represents a structure with capped lines prior to polishing. FIG. 9b shows an SEM micrograph of the cross-section of a multilayer structure after chemical-mechanical polishing has removed the tungsten and Al—Cu alloy above the top surface of the $SiO_2$ projections.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A semiconductor device comprising:
   a dielectric layer;
   at least one high aspect ratio submicron hole or line in the dielectric layer;
   a liner in the at least one hole or line;
   a conductive metal or alloy within the liner, the conductive metal or alloy having a surface; and
   a metal-containing layer in contact with at least part of the conductive metal or alloy surface.

2. The semiconductor device of claim 1 wherein the liner is a refractory metal or an alloy or compound thereof.

3. The semiconductor device of claim 1 wherein the conductive metal or alloy includes copper.

4. The semiconductor device of claim 1 wherein the conductive metal or alloy is the alloy $Al_xCu_y$ where x+y=1 and x and y are less than or equal to 1.

5. The semiconductor device of claim 1 wherein the metal-containing layer is a refractory metal or an alloy or compound thereof.

6. The semiconductor device of claim 1 wherein the liner and metal-containing layer are made of the same material.

7. The semiconductor device of claim 1 wherein the dielectric layer has a surface and the liner has a sidewall, wherein the sidewall terminates substantially even with the dielectric layer surface.

8. The semiconductor device of claim 1 wherein the liner is a bilayer liner.

9. The semiconductor device of claim 1 wherein the dielectric layer has a surface therein and wherein the conductive metal or alloy surface is substantially even with the dielectric layer surface.

10. The semiconductor device of claim 1 wherein the metal-containing layer is in contact with all of the conductive metal or alloy surface.

11. The semiconductor device of claim 1 wherein the dielectric layer has a surface therein and the metal-containing layer is on the dielectric surface.

12. The semiconductor device of claim 1 wherein the liner is a refractory metal or an alloy or compound thereof and the refractory metal or an alloy or compound thereof includes tantalum.

13. The semiconductor device of claim 1 wherein the metal-containing layer is a refractory metal or an alloy or compound thereof and the refractory metal or an alloy or compound thereof includes tantalum.

14. The semiconductor device of claim 1 wherein the liner is a first liner and further comprising a second dielectric layer having a second submicron hole or line therein and a second liner in the submicron hole or line wherein the metal-containing layer forms part of the second liner.

15. The semiconductor device of claim 1 wherein the liner is substantially conformal.

16. The semiconductor device of claim 7 wherein the conductive metal or alloy surface is substantially even with the dielectric layer surface.

17. The semiconductor device of claim 16 wherein the metal-containing layer is in contact with all of the conductive metal or alloy surface.

18. The semiconductor device of claim 16 wherein the metal-containing layer is on the dielectric surface.

19. The semiconductor device of claim 8 wherein at least one layer of the liner comprises a refractory metal or an alloy compound thereof.

20. The semiconductor device of claim 18 wherein the surface area of the conductive metal or alloy surface is less than the surface area of the metal-containing layer in contact with the conductive metal or alloy surface.

21. The submicron device of claim 13 wherein the dielectric layer comprises a plurality of insulating layers.

22. The semiconductor device of claim 14 wherein the second hole or line is in a surface of the second dielectric layer and the first liner has a sidewall, wherein the sidewall terminates substantially even with the second dielectric layer surface.

23. The semiconductor device of claim 14 wherein the second hole of line is in a surface of the second dielectric layer and the conductive metal or alloy surface is substantially even with the second dielectric layer surface.

24. The semiconductor device of claim 22 wherein the conductive metal or alloy surface is substantially even with the second dielectric layer surface.

25. A semiconductor device comprising:

a dielectric layer;

at least one high aspect ratio submicron hole or line in the dielectric layer, the at least one hole of line having at least first and second sections, wherein at least one of the width, length or height of the first section is different than the width, length or height of the second section;

a first liner in the first section of the at least one hole or line;

a first conductive metal of alloy within the first liner, the first conductive metal having a surface;

a metal-containing layer in contact with at least part of the conductive metal or alloy surface; and a second liner in the second section of the at least one hole or line, wherein the metal-containing layer forms part of the second liner.

26. A semiconductor device comprising:

a dielectric layer;

at least one high aspect ratio submicron hole or line in the dielectric layer;

a nonporous liner in the at least one hole or line;

a conductive metal or alloy within the liner, the conductive metal or alloy having a surface; and a metal-containing layer in contact with at least part of the conductive metal or alloy surface.

27. A semiconductor device comprising:

a dielectric layer;

at least one high aspect ratio submicron hole or line in the dielectric layer, the at least one hole of line having at least first and second sections, wherein at least one of the width, length or height of the first section is different than the width, length or height of the second section;

a nonporous first liner in the first section of the at least one hole or line;

a first conductive metal of alloy within the first liner, the first conductive metal having a surface;

a metal-containing layer in contact with at least part of the conductive metal or alloy surface; and wherein the second nonporous liner in the second section of the at least one hole or line, or in the metal-containing layer forms part of the second liner.

* * * * *